US012635422B2

(12) United States Patent
　　　Thieme

(10) Patent No.:　US 12,635,422 B2
(45) **Date of Patent:　\*May 19, 2026**

(54) ELECTRO-FORMED METAL FOILS

(71) Applicant: American Superconductor Corporation, Ayer, MA (US)

(72) Inventor: Cornelis Leo Hans Thieme, Westborough, MA (US)

(73) Assignee: American Superconductor Corporation, Ayer, MA (US)

( \* ) Notice: Subject to any disclaimer, the term of this patent is extended or adjusted under 35 U.S.C. 154(b) by 43 days.

This patent is subject to a terminal disclaimer.

(21) Appl. No.: 18/657,367

(22) Filed: May 7, 2024

(65) Prior Publication Data

US 2024/0407270 A1　　Dec. 5, 2024

Related U.S. Application Data

(63) Continuation of application No. 17/395,507, filed on Aug. 6, 2021, now Pat. No. 12,048,253.

(60) Provisional application No. 63/061,888, filed on Aug. 6, 2020.

(51) Int. Cl.
| *H10N 60/01* | (2023.01) |
| *C25D 1/04* | (2006.01) |
| *C25D 1/20* | (2006.01) |
| *C25D 5/00* | (2006.01) |
(Continued)

(52) U.S. Cl.
CPC ........... *H10N 60/0604* (2023.02); *C25D 1/04* (2013.01); *C25D 1/20* (2013.01); *C25D 5/617* (2020.08); *C30B 19/00* (2013.01); *C30B 30/02*

(2013.01); *H10N 60/0241* (2023.02); *H10N 60/0324* (2023.02); *C25D 5/611* (2020.08)

(58) Field of Classification Search
None
See application file for complete search history.

(56) References Cited

U.S. PATENT DOCUMENTS

| 5,898,020 A | 4/1999 | Goyal et al. |
| 6,458,223 B1 | 10/2002 | Thieme et al. |
| 6,537,689 B2 | 3/2003 | Schoop et al. |
(Continued)

FOREIGN PATENT DOCUMENTS

| WO | WO 2001/08233 A2 | 2/2001 |
| WO | WO 2007/094527 A1 | 8/2007 |

OTHER PUBLICATIONS

Andrew J. Detor et al., *Tailoring and patterning the grain size of nanocrysialline alloys*, Acta Materialia, vol. 55, Issue 1, 2007, pp. 371-379, https://doi.org/10.1016/j.actamat.2006.08.032.
(Continued)

*Primary Examiner* — Seth Dumbris
(74) *Attorney, Agent, or Firm* — Saul Ewing LLP

(57)　　　ABSTRACT

A process for producing a cube textured foil is described. The process includes providing a cube textured metal foil M. The process further includes electroplating an epitaxial layer of an alloy on the foil M, whereby the epitaxial layer substantially replicates the cube texture of the metal foil M. The process further includes electroplating a non-epitaxial layer of an alloy on the epitaxial layer. The process further includes separating the electroplated alloy from the cube textured metal foil M to obtain an electro-formed alloy with one cube textured surface.

8 Claims, 7 Drawing Sheets

520

530

(51) Int. Cl.
  C30B 19/00     (2006.01)
  C30B 30/02     (2006.01)

(56)           References Cited

U.S. PATENT DOCUMENTS

| | | |
|---|---|---|
| 7,425,255 B2 | 9/2008 | Detor et al. |
| 8,147,984 B2 | 4/2012 | Kashima et al. |
| 2002/0076567 A1* | 6/2002 | Honjo ............... H10N 60/0324 |
| | | 428/697 |
| 2006/0159949 A1 | 7/2006 | Yoo et al. |
| 2008/0274371 A1 | 11/2008 | Thieme et al. |
| 2009/0137401 A1 | 5/2009 | Paranthaman et al. |
| 2016/0163425 A1 | 6/2016 | Kashima et al. |

OTHER PUBLICATIONS

Abner Brenner et al., *Electrodeposition of Tungsten Alloys Containing Iron, Nickel, and Cobalt*, Research Paper RP1834, vol. 39, Oct. 1947, Journal of Research of the National Bureau of Standards, pp. 351-383.

Jae Wook Shin et al., *Epitaxial electrodeposition of freestanding large area single crystal substrates*, Applied Physics Letters, vol. 90, Issue 26, 261909, 2007, https://doi.org/10.1063/1.2752531, 3 pages.

Yoshihisa Kimoto et al., *Novel Electroforming Process for Bulk Nanocrystalline Ni-W Alloys with Minimizing W-Concentration Gradient and Fluctuation*, Materials Transactions, vol. 48, No. 6 (2007), pp. 1483-1491 (with Erratum, 1 page).

Naveen K. Mahenderkar et al., *Epitaxial lift-off of electrodeposited single-crystal gold foils for flexible electronics*, Science, vol. 355, Issue 6330, Mar. 17, 2017, pp. 1203-1206 , DOI: 10.1126/science.aam5830.

Srivatsan Sathyamurthy et al., *Chapter 5, American Superconductor: Second Generation Superconductor Wire—From Research to Power Grid Applications*, In: Madsen L., Svedberg E. (eds) Materials Research for Manufacturing. Springer Series in Materials Science, vol. 224. Springer, Cham. https://doi.org/10.1007/978-3-319-23419-9_5, (2016), pp. 131-160.

Ong Chun Yee Aaron., *Electrodeposition of NiW amorphous and nanocrystalline alloys*, Ph.D. Thesis, 2016, University of Singapore, pp. 1-186.

Gautam Priyadarshan., *Electrodeposition of Ni-W Y Ni-Mo under ultrasonication*, Ph.D. Dissertation, Dec. 2009, University of Nevada, Reno, 183 pages.

T. Yamasaki et al., *Formation of Amorphous Electrodeposited Ni-W Alloys and their Nanocrystallization*, NanoStructured Materials, vol. 10, No. 3, 1998, pp. 375-388.

Y.X. Zhou et al., *The manufacturing of an electroplated Ni layer on textured Cu substrate for Cu-based HTS coated conductors*, Superconductor Science and Technology, vol. 18 (2005) pp. 107-111, doi: 10.1088/0953-2048/18/1/017.

International Searching Authority/European Patent Office., International Search Report and Written Opinion of the International Searching Authority, Application No. PCT/US2021/044865, mailed Nov. 15, 2021, 15 pages.

J. Yoo et al., "Formation of Strongly Biaxial-Textured Ni Layer for YBCO Coated Conductor by Electrodeposition Process," IEEE Transactions on Applied Superconductivity, IEEE, USA, vol. 15, No. 2, Jun. 1, 2005, pp. 2624-2627, XP011134141, ISSN: 1051-8223, DOI: 10.1109/TASC.2005.847684.

Kim et al., "Texture Formation of Electroplated Nickel Alloy on Cu Substrate," Progress in Superconductivity, vol. 7, No. 2, April 30, 2006, pp. 145-151. (with English abstract).

\* cited by examiner

——— 200
——— 510 (optional)
——— 520

——— 530

——— 520

——— 530

ELECTRO-FORMED METAL FOILS

CROSS REFERENCE TO RELATED APPLICATIONS

The present application is a continuation of U.S. patent application Ser. No. 17/395,507 filed Aug. 6, 2021, which claims priority to U.S. Provisional Patent Application No. 63/061,888 filed Aug. 6, 2020, the disclosure of which is incorporated by reference herein in its entirety.

TECHNICAL FIELD

The present invention relates to a process for producing a cube textured foil and more specifically to such a process, which includes electroplating an epitaxial layer of an alloy on the foil.

BACKGROUND ART

In a world where the demand for electric power constantly increases and resources, space, and weight allowance are limited, electrical power density must be maximized while electrical power losses must be minimized. This is especially true for electric power conductors used in power transmission cables, electromagnets, motors and generators, which are a few examples of technologies that can immediately benefit from power-dense and low-loss conductors, and which may be realized by using High Temperature Superconductors (HTS). The foundation or template for many of today's HTS wires or tapes comprises a biaxially textured oxide buffer layer on top of a Ni alloy substrate. In one approach, a nickel alloy substrate is textured using a thermo-mechanical process and is called a rolling assisted biaxially textured substrate (RABiTS). It can be produced using a range of metals. These textured substrates are coated epi-taxially with various buffer layers, where the top buffer layer can serve as templates for a final superconducting layer (e.g., YBa2Cu3O7 or YBCO).

Typically nickel (Ni) or Ni alloys are utilized for the RABiTS biaxial textured metal foils. Nickel-Tungsten (NiW) alloys can be produced as a biaxial textured or so-called cube textured foil. These cube textured NiW foils have a very smooth surface and NiW grains with low grain boundary angles. Both aspects are critical for a template in HTS manufacture to support large current capacities in the HTS layer. Typical formulations of the alloy have nominal compositions Ni5at % W and Ni9at % W (Ni5W and Ni9W, respectively). The "5at % W" designates 5 atomic percent W, and the "9at % W" designates 9 atomic percent W. The base NiW alloy is usually custom made by a high purity nickel alloy manufacturer. The high cost template starts out as a multi-ton high purity melt, followed by a re-melt. These casts are hot forged and hot rolled to band and cold rolled to coils. Process time can be six to eight months, and further processing is still required to develop the appropriate cube texture necessary for the biaxial texture. For example, the coils are rolled with a Z-mill to final thickness, slit to the desired width and annealed to obtain a final texture. Total process time and relatively low yield, along with high price, makes this route limiting for the production of HTS.

Typical NiW substrates produced using Ni5W are magnetic. Attempts to produce non-magnetic substrates with Ni9W, which are necessary for AC HTS applications, require additional processing to achieve the required biaxial texture, for example, additional heat treatments during the deformation process.

Textured NiW or similar alloys may be useful in other (non HTS) applications, such as tribology, detectors, semiconductors, catalysts, batteries and electrodes for hydrogen generation, and could be beneficial, but due to production costs and long lead times have not been readily available for investigation and expansion to full potentials.

Therefore, there exists a need for new methods for producing cube textured foils, for example, for use as biaxially textured metal substrates for high current density HTS wires, at a reduced cost and increased performance level.

SUMMARY OF THE EMBODIMENTS

Improved methods for production of cube textured foils are disclosed, wherein an epitaxial layer of an alloy S is electroplated on a cube textured metal foil M. The epitaxial layer S substantially replicates the cube texture of the metal foil M. Additional alloy S layers can be electroplated on the epitaxial layer, and these additional layers can be electroplated at a faster rate than the electroplating of the epitaxial layer. As these fast deposition rates typically lead to non-epitaxy, this layer (or layers) are called the non-epitaxial or untextured part of the new foil. After completion, the combined electroplated alloy S layers are separated from the cube textured metal foil M, and these electroformed S alloys can be used as substrates. Metal foil M is discarded or recycled. The alloy S foils have one surface which is both smooth and highly textured. The other surface can be non-textured. Compositions including the cube textured foils are also provided by the technology. The cube textured alloy S foils can be utilized as substrates for a variety of technologies, for example, semiconductors, electromagnetic wave detectors, emission devices, band pass filters, tribology materials, and high temperature superconductors (HTS). Electroplating variables and methods for producing cube textured foils can be designed to produce foils with specific properties, for example, cube texture with non-magnetism (e.g., Ni9W) applied to HTS. The methods can produce cube textured foils in high throughput and with lengths well over a kilometer.

The technology includes a process for producing a cube textured foil, comprising: providing a cube textured metal foil M; and electroplating an epitaxial layer of an alloy on the foil M, whereby the epitaxial layer substantially replicates the cube texture of the metal foil M.

One or more of the following features may be included. The epitaxial alloy layer may comprise Ni(1-X-Y)BXCY and wherein B and C may be elements selected from the group consisting of W, Mo, and Cr; and wherein X may be 0.02-0.14 and Y is 0-0.14, in atomic fractions. The process may further include electroplating at least one non-epitaxial layer of Ni(1-X-Y)BXCY on the epitaxial layer. The non-epitaxial layer may have a random texture or a fiber texture or mixture thereof. Electroplating may comprise transporting the cube textured metal foil M through a first electroplating bath having a first solution comprising one or more of the elements to form Ni(1-X-Y)BXCy wherein the cube textured metal foil M is configured to operate as a cathode in the first electroplating bath to cause the first solution to be electroplated as the epitaxial layer on the cube textured metal foil M. Electroplating may comprise transporting the cube textured metal foil M having the epitaxial Ni(1-X-Y) BXCy layer deposited thereon through a second electroplating bath having a second solution comprising the elements to form Ni(1-X-Y)BXCy in any combination, wherein the electroplated cube textured metal foil M is configured to operate as a cathode in the second electroplating bath to cause the elements in the second solution to be electroplated on the epitaxial layer as the non-epitaxial Ni(1-X-Y)BXCy layer. The epitaxial layer may have a thickness of 0.5 to 80 microns and the non-epitaxial layer may have a thickness of 0.5 to 150 microns. The epitaxial layer may have a thickness of 2 to 6 microns and the non-epitaxial layer may have a thickness of 55 to 70 microns.

In addition, one or more of the following features may be included. The epitaxial layer and the non-epitaxial layer may each comprise one of Ni(1-X-Y)Wx, Ni(1-X-Y)Mox, Ni(1-X-Y)CrX, Ni(1-X-Y)WXMoY, or Ni(1-X-Y)WXCrY. The epitaxial layer and the non-epitaxial layer may each comprise Ni(1-X-Y)Wx wherein X is 0.08-0.10 and Y is 0. The cube textured metal foil M may have a length from 10 meters to 2000 meters. The process may further comprise removing the combined epitaxial and non-epitaxial layers from the cube textured metal foil M. The removing step may comprise spalling, etching, reverse plating, controlled delamination, peeling, reel-to-reel delamination, rolling delamination, thermal mismatch, or any combination thereof. The cube textured metal foil M may comprise a cube textured sacrificial layer on a surface thereof, wherein the sacrificial layer may comprise a metal different than the metal foil M. The sacrificial layer may have a thickness of ≤10 nm. The cube textured metal foil M may comprise a surface roughness of less than 50 nm Ra. The lattice mismatch between the epitaxial layer and the cube textured metal foil M may be ≤2%. The cube textured metal foil M may comprise Cu, Ni, NiFe, or any alloy thereof. The cube textured metal foil M may include a first surface having a cube texture and a second surface, opposite the first surface, having a cube texture, and wherein an epitaxial Ni(1-X-Y)BXCY layer may be electroplated on each of the two surfaces. The process may further comprise electroplating a non-epitaxial layer of Ni(1-X-Y)BXCY on the epitaxial Ni(1-X-Y)BXCY layers on each of the two surfaces. The process may additionally comprise removing the electroplated layers (epitaxial and non-epitaxial layers) from each of the first and second surfaces of the cube textured metal foil M; and the removing step may comprise spalling, etching, reverse plating, controlled delamination, peeling, reel-to-reel delamination, rolling delamination, thermal mismatch, or any combination thereof.

The technology also includes a foil comprising a first layer of Ni(1-X-Y)BXCY having a cube texture overlying a untextured layer of Ni(1-X-Y)BXCY, wherein B and C are selected from the group consisting of W, Mo, and Cr; and wherein X is 0.02-0.14 and Y is 0-0.14.

One or more of the following features may be included. The untextured layer may comprises one of a random texture or a fiber texture. The first layer may have a thickness of 0.5 to 80 microns and the untextured layer may have a thickness of 0.5 to 150 micron. The first layer may have a thickness of 2 to 6 microns and the untextured layer may have a thickness of 56 to 78 microns. The foil may have a length of 10 meters to 2000 meters. The first layer and the untextured layer may each comprise one of Ni(1-X-Y)Wx, Ni(1-X-Y)Mox, Ni(1-X-Y)CrX, Ni(1-X-Y)WXMoY, or Ni(1-X-Y)WXCrY. The first layer and the untextured layer may each comprise Ni(1-X-Y)Wx wherein X may be 0.08-0.10 and Y may be 0.

The technology additionally includes a high temperature superconductor (HTS) tape, comprising: a substrate comprising a first layer of Ni(1-X-Y)BXCY having a cube texture overlying an untextured layer of Ni(1-X-Y)BXCY, wherein B and C are selected from the group consisting of W, Mo, and Cr; and wherein X is 0.02-0.14 and Y is 0-0.14. There is at least one buffer layer disposed on the first layer of the substrate, the at least one buffer layer having a cube texture which substantially replicates the cube texture of the first layer of the substrate. And, there is also at least one HTS layer disposed on the at least one buffer layer; the at least one HTS layer having a cube texture which substantially replicates the cube texture of the at least one buffer layer.

The technology further includes a process for producing a cube textured foil, comprising: providing a cube textured metal foil M; electroplating an epitaxial layer of an alloy on the foil M, whereby the epitaxial layer substantially replicates the cube texture of the metal foil M. The epitaxial alloy layer comprises Ni(1-X-Y)BXCY. The electroplating step includes electroplating at least one non-epitaxial layer of Ni(1-X-Y)BXCY on the epitaxial layer, wherein B and C are elements selected from the group consisting of W, Mo, and Cr; and wherein X is 0.02-0.14 and Y is 0-0.14, in atomic fractions.

Epitaxial layers are characterized by an in-plane crystal structure and orientation which are identical or nearly identical to the substrate upon which they are grown.

As described herein, texture refers to a material, surface, or layer including crystal plane alignment. "Cube texture" refers to the texture of an FCC alloy foil with the general crystallographic notation {100}[001]. Here the (100) plane is parallel to the rolling surface, the <001> direction is the rolling direction, <010> the transverse direction, and <100> the normal direction to the rolling plane. The individual cube textured alloy grains have no perfect orientation (in that case they would form a single crystal) but show some deviation from ideal, which can easily be measured. A "sharp" cube texture shows a low variation from ideal. The grain size of electroplated alloy S can vary greatly, depending on location and definition of what constitutes a grain boundary. For example, if Cu is used for the cube textured metal foil M one can expect the Cu surface grains to be in the 50-100 micro-meter (or micron, □m, or um) range. The initial epitaxial alloy S layer might start as a nano-crystalline layer in the initial stage (first few seconds) but if grown properly, the grain boundaries between these nanoscale grains will be close to 0-1° and combine to form much larger grains, well over 1 micron in size, or possibly well over 10 microns. The second alloy S layer, grown at a much higher rate, could initially show some epitaxial relation with the first layer but soon form a fiber texture or a randomly oriented fine-grained structure. Depending on the composition of alloy S and deposition rate, some amorphous regions without any crystallinity might also be present. As used herein, "non-epitaxial" or "non-textured" can include a remnant of the epitaxial growth, polycrystalline, fiber texture, random texture, a transition from crystalline to non-crystalline, microcrystalline, amorphous, and mixtures of the same.

As used herein, electro-forming or "E-forming" is a process of making articles by electroplating of a metal onto a pattern (here, a smooth textured foil surface), followed by removal of the deposited layer. The deposited layer is then used independently, without the pattern. E-forming as described herein can include, for example electroplating, or epitaxial E-forming, which refers to by means of an epitaxial deposition process. "E-formed" can also refer to electro-formed and epitaxially-formed herein.

As used herein, a "foil" is a metal or alloy material with a thickness less than 0.25 mm, but thicker materials may be used. For example, a cube textured foil may include an epitaxial layer with a thickness of about 80 microns, a non-epitaxial layer with a thickness of about 150 microns, and a combined thickness of about 230 microns (epitaxial layer+ non-epitaxial layer). A foil may optionally have more than one layer.

DETAILED DESCRIPTION OF SPECIFIC EMBODIMENTS

The technology herein provides a process for producing an alloy S foil with one surface being cube textured and the other being non-epitaxial and fine-grained. The processes can be continuous reel-to-reel designed for high throughput by utilizing, for example, multiple electroplating tanks. The processes can produce cube textured foils in lengths of about 10 meters to about 2 kilometers or more. Compositions including cube textured foil are also disclosed herein. The processes begin with providing a cube textured metal foil M which will act as a template for growing the first epitaxial layer of alloy S. The cube textured metal foil M may include any metal that provides a cube texture on at least one surface. Non-limiting examples of suitable metals for the cube textured metal foil M are copper, nickel, nickel-iron, or an alloy thereof. As metal foil M is recycled or discarded at the end of the process it is preferably cheap, easy to manufacture with a sharp cube texture throughout and a very smooth surface on one side or both sides. It also should be chemically compatible with the plating solutions. One example is Cu when plating NiW alloys using a conventional citrate plating bath.

The cube textured metal foil M can be smooth on at least one surface, for example, with a surface roughness of less than 15 nm Ra, or less than 50 nm Ra, or less than 100 nm Ra. As used herein, Ra refers to the arithmetic average of the roughness profile. An epitaxial layer of an alloy S is deposited on the cube textured metal foil M, and the epitaxial layer substantially replicates the cube texture of the cube textured metal foil M. The deposition utilizes a technique that can produce an epitaxial layer on the cube textured metal foil M, for example, electroplating. Applied to HTS, the epitaxial layer of an alloy includes Ni-9at % W or more general, Ni(1-X-Y)BXCY. B and C are elements selected from the group consisting of W, Mo, and Cr; X is 0.02-0.14 and Y is 0-0.14, in atomic fractions.

Figure 1A:
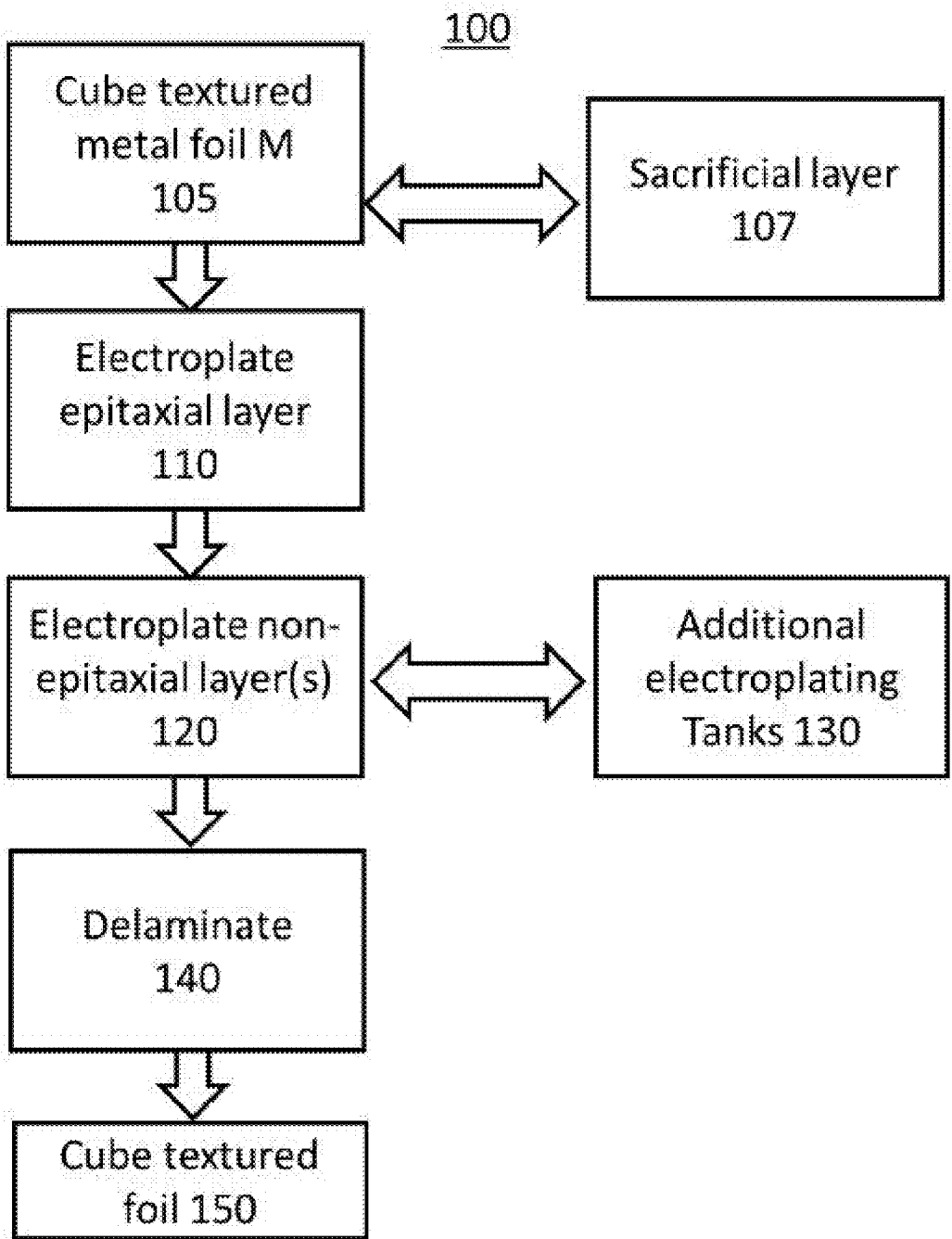
FIG. 1A shows an example flow diagram of a process for producing a cube textured foil.

An example of a general process for producing a cube textured foil is shown in the flow diagram 100 of FIG. 1A, wherein at step 105 a cube textured metal foil M, as described above, is provided. The cube textured metal foil M can be provided in a length of about 10 meters to about 2 kilometers or more, for example, on coils or reels. The length can be cut at any point in the process to shorter lengths. The width of the cube textured metal foil M is typically 50 to 80 mm but can be as narrow as 4 mm or as wide as 150 mm. In some examples, the edge of the cube textured metal foil M or cube textured alloy S foil is removed after its formation to provide a smooth edge. Further, the shape of the cube textured metal foil M is not limited by the examples described herein, which include a flat foil or a round or flattened wire shape.

In optional step 107, in FIG. 1A, on a surface of the cube textured metal foil M a sacrificial layer that includes a cube texture may be formed. An epitaxial layer of an alloy S is electroplated at step 110 on the cube textured metal foil M, whereby the epitaxial layer substantially replicates the cube texture of the metal foil M. The electroplating may include transporting the cube textured metal foil M through a first electroplating bath having a first solution comprising the elements for the desired alloy. The cube textured metal foil M is configured to operate as a cathode in the first electroplating bath to cause the first solution to be electroplated as the epitaxial layer on the cube textured metal foil M.

At least one high rate, fine grained (non-epitaxial) layer of alloy S can be electroplated at step 120 on the epitaxial layer of alloy S. Electroplating of the non-epitaxial layer can be in the second electroplating tank or in multiple electroplating tanks 130, to increase throughput. The alloy S used for the non-epitaxial layer is preferably the same as alloy S in the epitaxial layer but can be different if so desired. In step 140 a delamination process is undertaken, which includes removing the combined epitaxial and non-epitaxial layers from the cube textured metal foil M. The removal can be by any means known in the art, for example, spalling, etching, reverse plating, controlled delamination, peeling, reel-to-reel delamination, rolling delamination, thermal mismatch, or any combination thereof. After delamination in step 140, an alloy S foil with one cube textured surface is formed at step 150.

If a sacrificial layer is utilized on the cube textured metal foil M, the epitaxial layer of an alloy may be electroplated on the sacrificial layer as described above. The sacrificial layer can include an element, metal or material different than the cube textured metal foil M. The sacrificial layer may include a cube texture. The sacrificial layer may have a lattice mismatch, measured between the cube textured metal foil M and the sacrificial layer or between the sacrificial layer and the epitaxial layer. For example, the sacrificial layer can have a thickness of ≤10 nm or about 1 or 2 atomic layers. After delamination, the sacrificial layer remains on the cube textured metal foil M. The formation of the sacrificial layer in step 107 may promote a reduction in defects or even a defect-free delamination, promote epitaxial growth, or both. Examples of sacrificial layers are 1-5 nm thick FeNi, 1-1.5 nm FCC Fe (stable to about 2 nm before converting to bcc Fe) 1-2 nm Pd, or a mono-layer sulfur superstructure. The latter is an example of a layer with a cubic structure but not a cube texture.

Figures 1B, 1C:
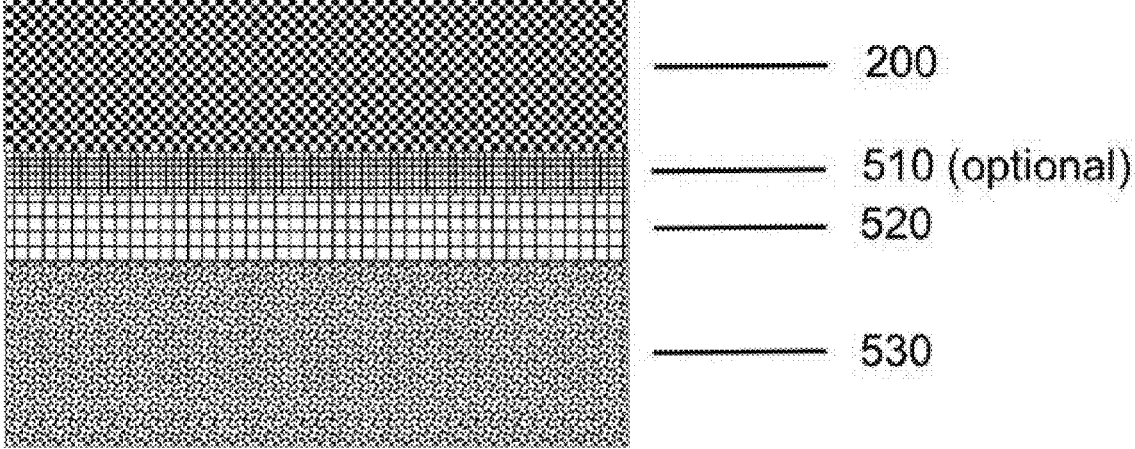
FIG. 1B shows a cross sectional view of a cube textured metal foil M with an optional sacrificial layer, an epitaxial layer, and a non-epitaxial layer.
FIG. 1C shows a cross sectional view of a cube textured foil including an epitaxial layer and a non-epitaxial layer.

Referring to FIG. 1B, the cube textured metal foil M 200 can optionally include a sacrificial layer 510 on a surface of the cube textured metal foil M. The epitaxial layer 520 and the non-epitaxial layer 530 have not been delaminated from the cube textured metal foil M in FIG. 1B. FIG. 1C illustrates the alloy S foil with one cube textured epitaxial layer 520 and one non-epitaxial layer 530, without metal M.

The E-formed cube textured foil illustrated in FIG. 1C can be utilized as a cube textured substrate for another process or composition. Non limiting examples of processes that can include a cube textured substrate are fabrication of semiconductors, fabrication of detectors tuned to specific ranges of electromagnetic radiation, fabrication of devices that emit light or electromagnetic waves, fabrication of band pass filters, tribology materials, crystal growth, nanotechnology, and high temperature superconductors (HTS).

Figure 2:
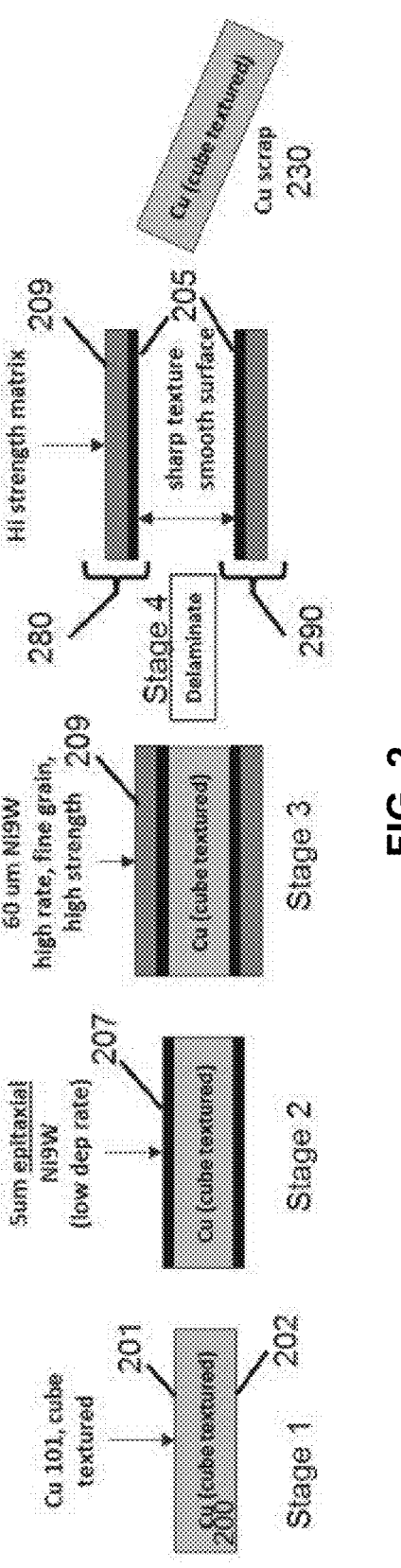
FIG. 2 shows an example schematic of E-forming of Ni9W foil.

FIG. 2 shows an example applied to HTS, an example method for simultaneously producing two Ni9W cube textured foils wherein Ni9W refers to Ni 9% atomic W. FIG. 2 shows a schematic of E-forming of Ni9W. It illustrates the concept of four stages in making electro-formed Ni9W (or, alternatively, Ni(1-X-Y)BXCY wherein B and C are elements selected from the group consisting of W, Mo, and Cr; and wherein X is 0.02-0.14 and Y is 0-0.14, in atomic fractions; or Ni(1-X-Y)Wx with X about 0.08-0.10 and Y=0). They produce a cube textured substrate for use in making an HTS wire. Stage 1 is the manufacture of long lengths of cube textured Cu (or, alternatively, Ni, NiFe, or an alloy thereof), which combines a sharp texture with a smooth surface 201, 202 (e.g., with a surface roughness of less than 15 nm Ra, or less than 50 nm Ra, or less than 100 nm Ra.), on both sides, shown at the left of FIG. 2. The second stage (Stage 2) is the epitaxial deposition of a thin Ni9W layer 207, which may be about 0.5 micron to about 80 microns, or about 2 to about 6 microns thick. Also usable are Ni(1-X-Y)BXCY. The initial epitaxial deposition rate can be low (e.g., 0.02-0.05 A/cm$^2$) to obtain good epitaxy. The third stage (Stage 3) can be a fast deposition (e.g., a deposition at a current density of around 0.15 to 0.2 A/cm$^2$) of 0.5 to 150 μm or about 60 μm Ni9W or Ni(1-X-Y)BXCY 209 to combine a higher deposition rate and higher line speed with a fine grain size (e.g., ~1 μm) for strength. The fourth stage (Stage 4) can be a controlled delamination to separate the Ni9W foils 280, 290 from the Cu foil. As described above in FIG. 1, the delamination can be by any means known in the art. A sacrificial layer (not shown) on the cube textured metal foil M may promote a defect-free delamination, promote epitaxial growth, or both.

Suitable metals for the cube textured metal foil M 200 are copper, nickel-iron, or an alloy thereof. An epitaxial layer 207 and non-epitaxial layer 209 can include Ni, W, Mo, Cr, or any combination thereof. An epitaxial layer 207 and a non-epitaxial layer 209 can include Ni(1-X-Y)BXCY; wherein B and C are elements selected from the group consisting of W, Mo, and Cr; and wherein X is 0.02-0.14 and Y is 0-0.14, in atomic fractions. Non-limiting examples of alloys included in the epitaxial layer and non-epitaxial layer are one or more of Ni(1-X-Y)Wx, Ni(1-X-Y)Mox, Ni(1-X-Y)CrX, Ni(1-X-Y)WXMoY, and Ni(1-X-Y)WXCrY.

As illustrated in FIG. 2, the Ni9W inner surfaces 205, originally in contact with metal M, are sharply textured and have a smooth surface, of around 12-20 nm Ra. Applied to HTS, this Ni9W inner surface 205 will be the deposition surface for an Yttria seed layer, the first layer in a buffer layer for YBCO deposition. In this example, annealing of the Ni9W is not needed for texture. Annealing can be considered for a strain relief if desired. A continuous method for annealing, for example, can include passing the Ni9W foil through a tube furnace in a reducing atmosphere. Two cube textured foils 280, 290 are removed from the cube textured metal foil, and the cube textured metal foil M can optionally be recycled at 230.

Figure 3A:
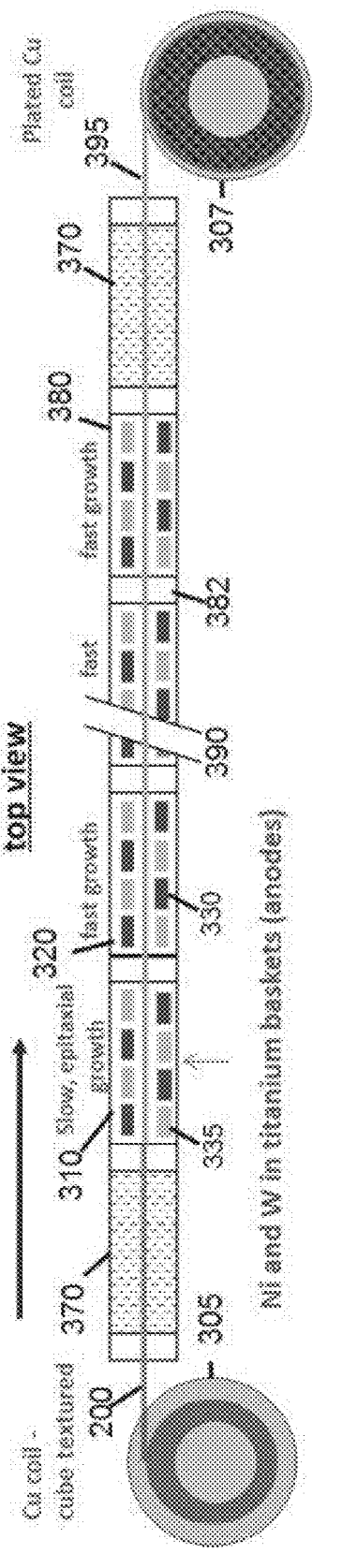
FIG. 3A shows a top view of a Ni9W reel-to-reel Ni9W electroplating line with horizontal pancake coils or reels.
Figure 3B:
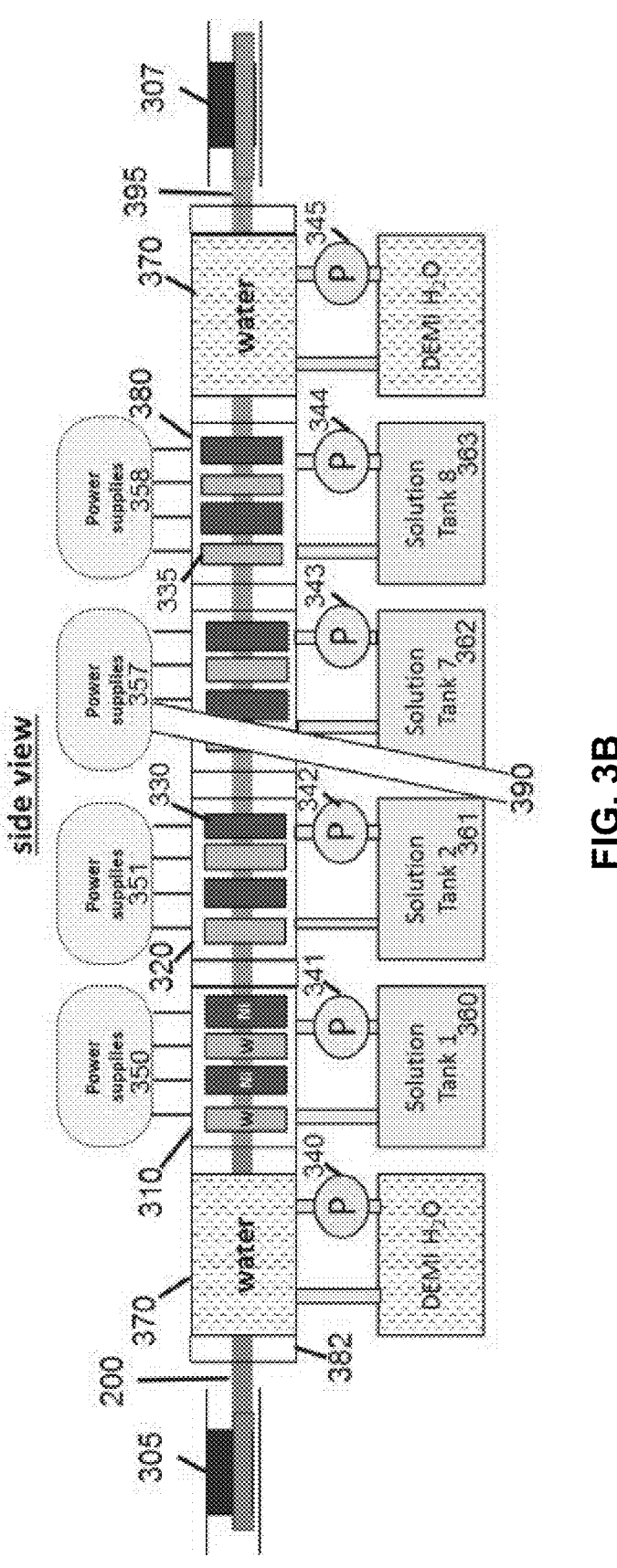
FIG. 3B shows a side view of the electroplating line shown in FIG. 3A.

An example electroplating line for producing a cube textured foil is shown in FIG. 3A (top view) and FIG. 3B (side view), which illustrate a reel-to-reel Ni9W (or Ni(1-X-Y)BXCY as described above) electroplating line with horizontal pancake coils or reels 305 for introduction of cube textured metal foil M 200 and for reeling 307 of electroplated cube textured foil 395. These figures illustrate a reel-to-reel electroplating line with eight plating cells, two rinse tanks (370) and 11 antechambers (382 the spaces between the plating cells and/or rinse cells). The long length of the electroplating line has been shortened, for illustration purposes, as designated by the slanted line 390 near the center of FIG. 3A and FIG. 3B. Moving from left to right, the cube textured Cu foil 200 (Cu, Ni, NiFe, or an alloy thereof) enters cell 1 (310) for the epitaxial deposition of ~0.5-80 μm Ni9W on both sides. The Cu foil acts as the cathode. The Cu foil can travel vertically. In the side view of FIG. 3B, the Cu foil 200 is shown traveling through the electroplating line left to right. The plated Cu then continues through cell 2 (320) though additional cells to cell 8 (380) for the fast deposition of the fine-grained but not necessarily cube textured Ni9W, which can be non-epitaxial. The texture of this second Ni9W layer (~0.5-150 μm or ~55-70 μm thick) is a non-epitaxial layer of any kind and may be a fiber or a random texture, or a mixture of the two. The diagrams in FIG. 3B shows the individual power supplies 350, 351, 357, 358 and solution tanks 360, 361, 362, 363 with pumps, P (340-345), for each cell and rinse tank 370. Each cell uses consumable anodes: the Ni 330 and W 335 are placed in titanium baskets which are connected to the individual power supplies.

As illustrated in FIG. 3A and FIG. 3B, a reel-to-reel process for electroplating an epitaxial layer of an alloy on a cube textured metal foil M can utilize multiple electroplating tanks and a reel of the cube textured metal foil M (left 305), with the product 395 collected on a reel (right 307). The cube textured metal foil M can be guided into a first electroplating tank, with sliding or rolling contacts (not shown) to make the cube textured metal foil M into a cathode. Electroplating in the first electroplating tank 310 can be at a rate and conditions to produce an epitaxial layer of an alloy. Electroplating can then include transporting the cube textured metal foil M having the epitaxial layer deposited thereon through a second electroplating tank 320 having a second solution comprising the elements Ni, B, C, in any combination. Rolling or sliding contacts may be used in the second and additional tanks, wherein the electroplated cube textured metal foil M is configured to operate as a cathode in the second and additional electroplating tanks to cause the elements in the second solution to be electroplated on the epitaxial layer as the non-epitaxial layer.

The electroplating described herein is not limited by the type of power supplies and the applied current. The power supplies can provide, for example, direct current (DC), pulsed current, reverse pulse current, a square or other wave current, periods of one form of current followed by another form. Typically, a low and constant DC current is initially utilized to provide epitaxial growth but other current modes are possible as well.

Replenishment of metal ions in an electrolyte of an electroplating tank can be accomplished by utilizing, for example, tungsten 335 and nickel 330 anodes (FIGS. 3A-3B), or NiW alloy anodes, or simply by adding Ni and W salts to the solution tanks. Pumps (340-345, FIG. 3B) can be used to circulate the solution from storage tank to plating cell and apply filtration to remove unwanted deposits. The concentration of metal ions in an electrolyte, for example, can be held at a W:Ni atomic ratio of 2.3:1, yet epitaxial layers of 3-25 atomic percent tungsten can be deposited by tuning of electroplating variables discussed below. One or more additional electrodes (anodes or cathodes) may also be present in each electroplating bath or tank.

Electroplating of NiW or NiMo is referred to as induced co-deposition. Neither W nor Mo ca be deposited in pure form but can be plated in alloy form if the second element is Ni, Co or Fe. For HTS applications the magnetism of Co and Fe is problematic but that of Ni can be dealt with if the W concentration exceeds 8-9 at %. Extensive research has been carried out since 1946 to formulate a proper bath (Ni:W ratios, various complexing agents and additives) and plating conditions (pH, current densities, and temperature).

| Nickel sulphate | 0.06 | mol/L |
| Sodium tungstate | 0.14 | mol/L |
| Citric acid | 0.5 | mol/L |
| Ammonium chloride | 0.5 | mol/L |
| Sodium bromide | 0.15 | mol/L |
| Temperature | 75 | ° C. |
| pH | 7.5 | |
| Current density | 0.05-0.3 | A/cm$^2$ |

A so-called Yamasaki bath for electroplating of NiW alloys
T. Yamasaki, R. Tomohira, Y. Ogino, P. Schloßmacher & K. Ehrlich, Formation of Ductile Amorphous & Nanocrystalline Ni—W Alloys by Electrodeposition", Plating & & Surface Finishing 2000, Vol 87, pp. 148-151.

For most purposes, a so-called Yamasaki bath, shown above, is now the standard solution for NiW electroplating and widely practiced across the field (with minor variations). It can yield a wide range of compositions despite the constant Ni:W ratio. The main variables are temperature and current density.

Formation of hydrogen can be an issue in this type of co-deposition. It needs to be addressed, as adsorption of the $H_2$ by the electroplated NiW can embrittle the plate. Proper current profile selection can strongly reduce this effect, while the use of, for example, a sonicated bath can prevent $H_2$ gas bubbles sticking to the surface.

The high-deposition rate, fine grained non-epitaxial layer can make a substrate stronger than its conventional thermo-mechanical equivalent. With the cast-and-roll process the final grain size after texture-annealing is typically in the 20-40 micrometer range. A 1-5 micrometer average grain size will improve the yield stress which is, in addition to the inherent alloy strength, inversely proportional to the square root of the average grain size. This can imply that the overall thickness can be reduced and retain a comparable overall strength of the superconducting wire, an economical benefit. Additional strength can also be utilized during a delamination process, wherein the combined epitaxial and non-epitaxial alloy S layer are removed from the cube textured metal foil M (e.g., FIG. 4). As discussed above, if a sacrificial layer is utilized on the cube textured metal foil M, the sacrificial layer can improve delamination of the epitaxial layer from the cube textured metal foil M. Delamination can be accomplished by any means known in the art. Delamination should provide an efficient removal of the epitaxial layer from the cube textured metal foil M, by for example, producing a smooth epitaxial layer free of cracks without inducing surface defects.

Examples of suitable methods for delamination are spalling, etching, reverse plating, controlled delamination, peeling, reel-to-reel delamination, rolling delamination, thermal mismatch, or any combination thereof. Continuous delamination can be used to produce long cube textured foils, for example 10 meters to 2 kilometers long. A continuous delamination can be utilized to improve throughput of the production process.

In some examples, there may be a high thermal mismatch between a cube textured foil and an epitaxial layer (or non-epitaxial layer). An example of a high thermal mismatch between copper and nickel is at 77K: $\Delta L/LCu=0.31\%$, $\Delta L/LNi=0.23\%$.

Figure 4:
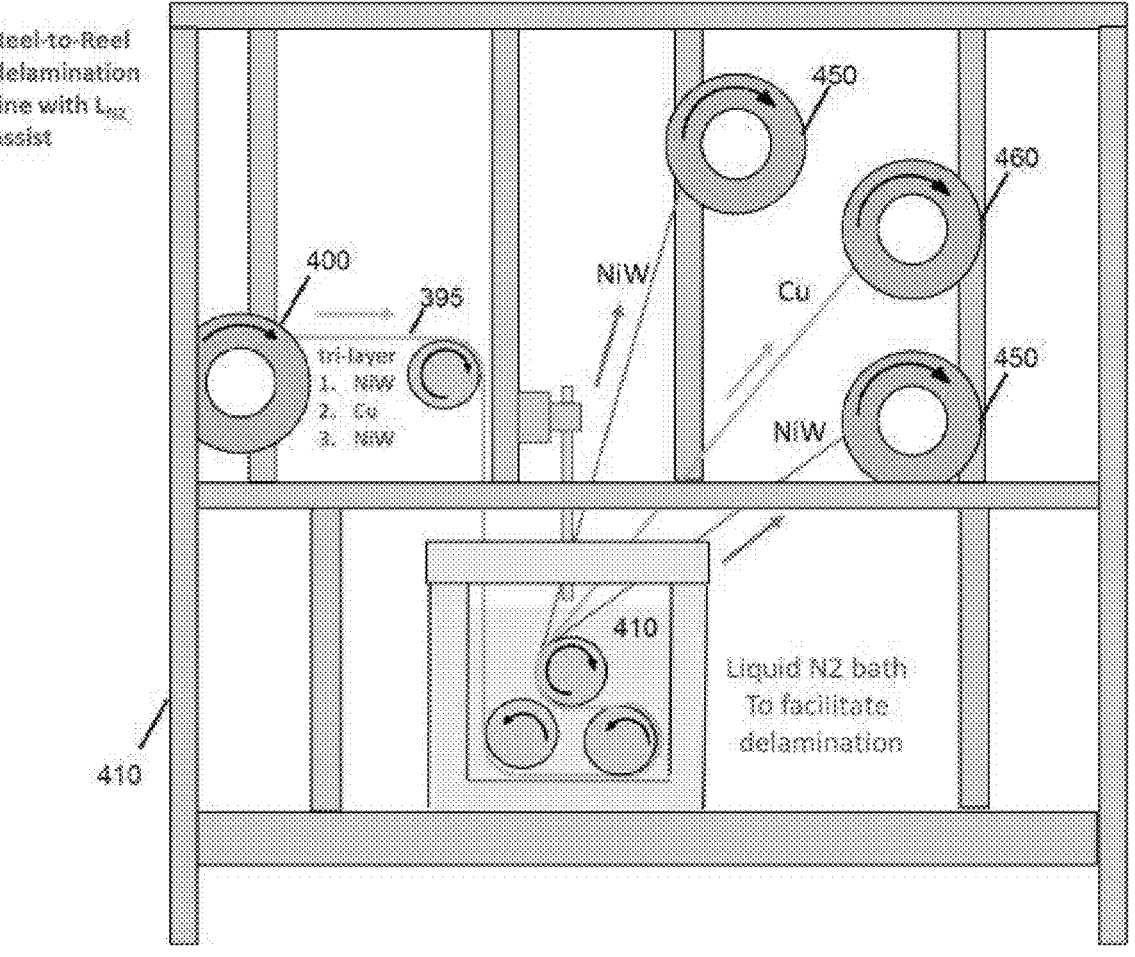
FIG. 4 shows an example reel-to-reel delamination line with liquid nitrogen assist.

An example of a reel-to-reel delamination line with liquid nitrogen assist is shown in FIG. 4. The figure shows a side view of a frame 410 with various reels, driven by motors. The plated Ni9W/Cu/Ni9W trilayer 395 leaves the left pay-off reel 400 and is guided by rollers through a liquid nitrogen bath 410. The difference in thermal contraction between Ni9W and Cu enhances the shear force at the interface when entering the bath, while the difference in thermal expansion does the same when exiting the bath. Both facilitate the delamination.

Reel-to-reel delamination can provide rolls of cube textured NiW foil 450 ready for buffer layer deposition and subsequent HTS manufacture. A roll of cube textured metal foil M 460 can be ready for recycling or even for re-deployment. Reel-to-reel delamination can be a green-chemistry process by providing a cube textured metal foil M for recycling using little to no chemicals. In the example shown in FIG. 4, liquid nitrogen assist is utilized with reel-to-reel delamination. However, any method of assisted delamination, as discussed above, may be utilized with reel-to-reel configurations.

Figure 5:
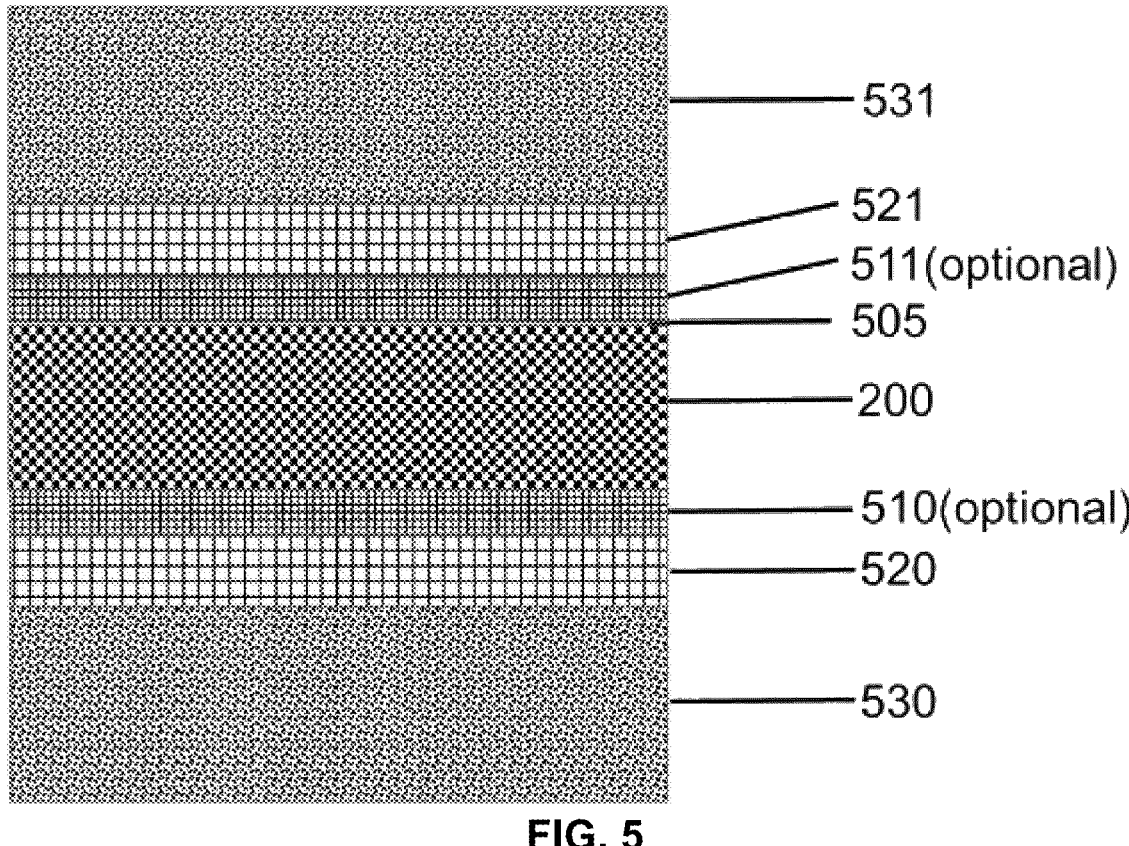
FIG. 5 shows a cross sectional view of an article with a cube textured metal foil M including two optional sacrificial layers, two epitaxial layers of an alloy and two non-epitaxial layers of an alloy.

As illustrated in FIG. 5, the technology herein can provide an intermediate product comprising a cube textured metal foil M 200 and an epitaxial layer of an alloy 520 overlying the cube textured metal foil M. The sacrificial layers 510 and 511 are optional. The article may further comprise a non-epitaxial layer 530. The cube textured metal foil M 200 illustrated in FIG. 5 may have a second surface 505 having a cube texture. A second epitaxial Ni(1-X-Y)BXCY layer (521) can be on the second surface 505. An optional sacrificial layer 511 may be disposed on the second surface 505 between a second epitaxial layer and the cube textured metal foil M 200. A non-epitaxial layer 531 can be on the second epitaxial layer. The epitaxial layer substantially replicates the cube texture of the metal foil M. The epitaxial layer can include Ni(1-X-Y)BXCY and wherein B and Care elements selected from the group consisting of W, Mo, and Cr; and wherein X is 0.02-0.14 and Y is 0-0.14. The optional sacrificial layer 510 can be provided on the cube textured metal foil M 200 disposed between the cube textured metal foil M and the epitaxial layer 520. The optional sacrificial layer can be disposed on the cube textured metal foil M in any one of FIGS. 2-4. The sacrificial layer can, for example, be cube textured and can include a different metal or alloy compared to the cube textured metal foil M. The sacrificial layer can improve epitaxial deposition. The sacrificial layer can improve later delamination of the epitaxial layer from the cube textured metal foil M. In some examples, the sacrificial layer can provide other functions, for example, to prevent diffusion or to provide a thermal coefficient of expansion.

In FIG. 5, the cube textured metal foil M 200 can have a length from about 10 meters to about 2000 meters or longer. The additional layers can have lengths corresponding to the foil 200. The non-epitaxial layer 530 can have one of a random texture or a fiber texture or mixture thereof. The epitaxial layer 520 can have a thickness of about 0.5 to 80 microns, or about 2 to 6 microns. The non-epitaxial layer 530 can have a thickness of about 0.5 to 150 microns, or from about 55 to 70 microns. In FIG. 5, the cube textured metal foil M 200 can include Cu, Ni, Fe, or any combination thereof. The epitaxial layer and the non-epitaxial layer can each include Ni(1-X-Y)Wx wherein X is 0.08-0.10 and Y is 0.

The epitaxial layer 520 on the cube textured metal foil M 200 can have a lattice mismatch in the range from about 0% to about 2%, about 0% to about 4%, about 0% to about 6%, about 0% to about 8%, or about 0% to about 10%. If an optional sacrificial layer 510 is disposed, the lattice mismatch may be measured between the sacrificial layer and the cube textured metal foil M 200, between the sacrificial layer and the epitaxial layer 520, or between the cube textured metal foil M 200 and the epitaxial layer 520.

Figure 6:
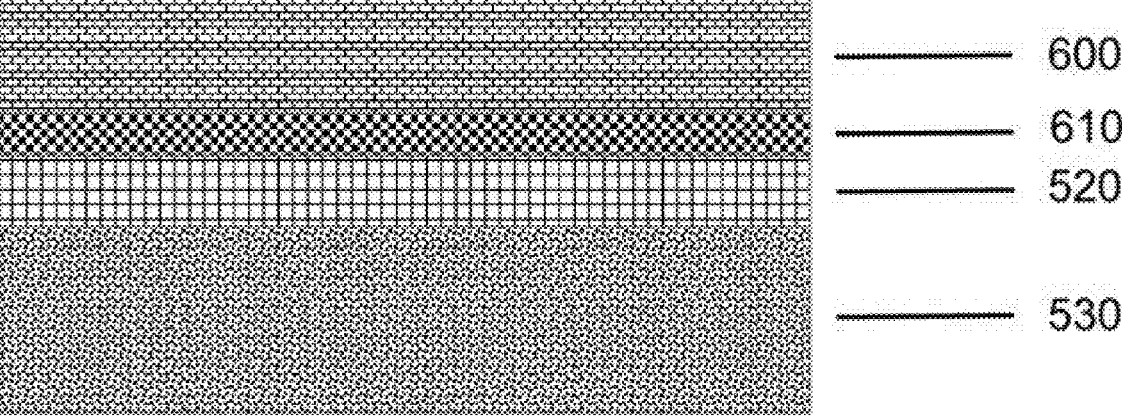
FIG. 6 shows a cross sectional view of a high temperature superconductor (HTS) tape including a substrate comprising a non-epitaxial layer of an alloy and an epitaxial layer of an alloy.

The methods herein can provide cube textured foil having a cube texture 520 overlying a non-epitaxial layer 530 (FIG. 1C, FIG. 5 and FIG. 6). The foil can comprise a first layer of Ni(1-X-Y)BXCY having a cube texture 520 overlying a non-epitaxial layer of Ni(1-X-Y)BXCY 530; wherein B and C are selected from the group consisting of W, Mo, and Cr; and wherein X is 0.02-0.14 and Y is 0-0.14. As discussed above, the foil can be utilized as a substrate for a large variety of technologies. The foil is illustrated as a HTS substrate by layers 520 and 530 in FIG. 6 (e.g., FIG. 1C). The layer 520 may have a sharp texture and a surface smoothness of 12-20 nm Ra.

FIG. 6 shows a cross sectional view of a high temperature superconductor (HTS) tape with a non-epitaxial layer of an alloy 530, an epitaxial layer of an alloy 520, at least one buffer layer 610, and at least 1 HTS layer 600. In FIG. 6, at least one HTS layer 600 can be formed of any suitable superconductor known in the art. For example, the at least one HTS layer can include a material with the general formula (RE)Ba2Cu3O(7-X), with $0 \leq X \leq X$; (RE)Ba2Cu3OY; or (RE)Ba4Cu7OY; (Y=7) with RE including at least one primary rare earth metal. Yttrium is an example of a rare earth metal. The at least one HTS layer 600 may also include a second RE element in addition to the Y. For example, a YBCO superconductor layer may include a dysprosium which may be present in an amount of up to 75% relative to the primary rare earth metal. In some examples, dopants can be present in an amount of at least about 1% to enhance the critical current in magnetic fields. Examples of dopants are a transition metal such as Zr, Nb, Ta, Hf or Au. The dopant may combine with other elements in the superconductor to form a single or mixed metal oxide.

The cube textured foil or substrate has a cube texture in the epitaxial layer 520. In FIG. 6, the epitaxial layer 520 may include texture that is transferred to the at least one buffer layer 610. The epitaxial layer 520 may include a texture that is transferred to the at least one HTS layer 600. As discussed above, texture refers to a microstructure including crystal plane alignment and the presence of low angle grain boundaries in the HTS layer. A high degree of both aspects in the HTS layer can allow a polycrystalline superconductor layer to exhibit near single crystal-like performance. The single crystal-like performance can increase current capacity in the final superconducting wire.

The at least one buffer layer 610 can, for example, prevent diffusion of metal from the substrate into the one or more HTS layers. The at least one buffer layer can include a metal oxide. For example, the metal oxide layers can prevent diffusion of the metal from the epitaxial Ni9W (alloy S) layer or from other layers into the at least one HTS layer during the HTS wire manufacturing process. As a non-limiting example, the at least one buffer layer can include CeO2.

The cube textured foil comprising 520 and 530 can be from about 10 meters to about 2 kilometers long. Applied to HTS, the non-epitaxial layer 530 can be about 0.5 to about 150 microns thick, or about 55 to about 70 microns thick. The cube textured foil comprising 520 and 530 can be utilized to improve HTS AC current capacity, for example, by providing non magnetic Ni9W (e.g., Ni(1-X-Y)BXCY; wherein B and C are elements selected from the group consisting of W, Mo, and Cr; and wherein X is 0.02-0.14 and Y is 0-0.14, in atomic fractions) in lengths of about 10 meters to 2 kilometers. The methods and articles disclosed herein are not limited to HTS and can be applied to advancement of other technologies.

The cube textured foil comprising 520 and 530 can have an epitaxial layer 520 with thickness of about 0.5 to about 80 microns. The thickness of the non-epitaxial layer 530 can be higher than 150 microns for various applications. Other technologies that may include the foil 520 and 530, are, for example, tribology, detectors, semiconductors, catalysts, band pass filters, nano-crystals, batteries, and electrodes for hydrogen generation. The technology is also directed to components, machines, devices, parts, and kits including the production methods and articles described herein. The technology herein includes manufacturing processes, coating processes, and treatments including the methods disclosed herein.

As used herein, the term "about" and "approximately" are defined to be within 10%, 5%, 1%, or 0.5%.

As used herein, "consisting essentially of" allows the inclusion of materials or steps that do not materially affect the basic and novel characteristics of the claim. Any recitation herein of the term "including", particularly in a description of components of a composition or in a description of elements of a device, can be exchanged with the alternative expression "comprising".

What is claimed is:

1. A foil comprising an alloy of Ni(1-X-Y)BXCY, the foil having an epitaxial, non-magnetic layer of the alloy having a cube texture overlying a non-epitaxial, non-textured, non-magnetic layer of the alloy, wherein B and C are selected from the group consisting of W, Mo, and Cr; and wherein X is 0.02-0.14 and Y is 0-0.14.

2. The foil of claim 1, wherein the epitaxial, non-magnetic layer has a thickness of 0.5 to 80 microns and the non-epitaxial, non-magnetic layer has a thickness of 0.5 to 150 microns.

3. The foil of claim 1, wherein the epitaxial, non-magnetic layer has a thickness of 2 to 6 microns and the non-epitaxial, non-magnetic layer has a thickness of 56 to 78 microns.

4. The foil of claim 1, wherein the foil has a length of 10 meters to 2000 meters.

5. The foil of claim 1, wherein the alloy is selected from the group consisting of Ni(1-X-Y)WX, Ni(1-X-Y)MoX, Ni(1-X-Y)CrX, Ni(1-X-Y)WXMoY, and Ni(1-X-Y)WX-CrY.

6. The foil of claim 1, wherein the epitaxial, non-magnetic layer and the non-epitaxial, non-magnetic layer each comprise Ni(1-X-Y)WX wherein X is 0.08-0.10 and Y is 0.

7. The foil of claim 1, wherein the non-epitaxial layer has an average grain size of between 1 μm to 5 μm and the epitaxial layer has a Ra surface roughness of between 12 to 20 nm.

8. A foil comprising an alloy of Ni(1-X-Y)BXCY, the foil having an epitaxial, non-magnetic layer of the alloy having a cube texture overlying a non-epitaxial, non-textured, non-magnetic layer of the alloy, wherein:

B and C are selected from the group consisting of W, Mo, and Cr; and wherein X is 0.02-0.14 and Y is 0-0.14; and the non-epitaxial layer has an average grain size of between 1 μm to 5 μm.

<div align="center">* * * * *</div>